United States Patent
Chang et al.

(10) Patent No.: US 9,691,979 B2
(45) Date of Patent: Jun. 27, 2017

(54) RESISTIVE RANDOM ACCESS MEMORY AND METHOD OF FABRICATING THE SAME

(71) Applicant: Winbond Electronics Corp., Taichung (TW)

(72) Inventors: Shuo-Che Chang, Taichung (TW); Chia-Hua Ho, Taichung (TW)

(73) Assignee: Winbond Electronics Corp., Taichung (TW)

( * ) Notice: Subject to any disclaimer, the term of this patent is extended or adjusted under 35 U.S.C. 154(b) by 0 days.

(21) Appl. No.: 14/476,748

(22) Filed: Sep. 4, 2014

(65) Prior Publication Data
US 2015/0287915 A1 Oct. 8, 2015

(30) Foreign Application Priority Data

Apr. 2, 2014 (TW) ................ 103112328 A

(51) Int. Cl.
*H01L 45/00* (2006.01)
(52) U.S. Cl.
CPC ............ *H01L 45/146* (2013.01); *H01L 45/06* (2013.01); *H01L 45/08* (2013.01); *H01L 45/1233* (2013.01); *H01L 45/1253* (2013.01); *H01L 45/1608* (2013.01)
(58) Field of Classification Search
USPC ............................................. 257/4; 438/382
See application file for complete search history.

(56) References Cited

U.S. PATENT DOCUMENTS

| | | | |
|---|---|---|---|
| 8,466,461 B2 | 6/2013 | Seo et al. | |
| 8,877,550 B2 * | 11/2014 | Kumar | H01L 45/04 438/104 |
| 2005/0247921 A1 * | 11/2005 | Lee | G11C 13/0004 257/2 |
| 2009/0039332 A1 | 2/2009 | Lee et al. | |
| 2011/0002154 A1 * | 1/2011 | Mitani | G11C 13/0007 365/148 |

(Continued)

FOREIGN PATENT DOCUMENTS

| | | |
|---|---|---|
| CN | 102414819 | 4/2012 |
| JP | 2010251352 | 11/2010 |
| TW | I318437 | 12/2009 |

OTHER PUBLICATIONS

"Office Action of Taiwan Counterpart Application", issued on Dec. 23, 2015, p. 1-p. 5.

(Continued)

*Primary Examiner* — Hrayr A Sayadian
(74) *Attorney, Agent, or Firm* — Jianq Chyun IP Office

(57) ABSTRACT

A resistive random access memory includes a first electrode layer, a second electrode layer, and a stacked structure disposed between the first electrode layer and the second electrode layer. The stacked structure includes a conductive layer and a resistance variable layer. The material of the conductive layer includes $HfO_x$, the material of the resistance variable layer includes $HfO_y$, and $x<y$. Additionally, the diffusion rate of oxygen ions in the conductive layer is lower than the diffusion rate of the oxygen ions in metal.

9 Claims, 2 Drawing Sheets

(56) References Cited

U.S. PATENT DOCUMENTS

2012/0044749 A1 2/2012 Muraoka et al.
2012/0319071 A1 12/2012 Awaya et al.

OTHER PUBLICATIONS

"Office Action of Europe Counterpart Application", issued on Aug. 11, 2015, p. 1-p. 7.
"English Translation of Office Action of Taiwan Counterpart Application", issued on Dec. 23, 2015, 10 pages, in which the listed references were submitted on Jan. 19, 2016.

* cited by examiner

RESISTIVE RANDOM ACCESS MEMORY AND METHOD OF FABRICATING THE SAME

CROSS-REFERENCE TO RELATED APPLICATION

This application claims the priority benefit of Taiwan application serial no. 103112328, filed on Apr. 2, 2014. The entirety of the above-mentioned patent application is hereby incorporated by reference herein and made a part of this specification.

BACKGROUND OF THE INVENTION

Field of the Invention

The invention generally relates to a memory and a method of fabricating the same, and in particular, to a resistive random access memory and a method of fabricating the same.

Description of Related Art

The resistive random access memory (RRAM) is a memory unit which has been widely studied recently because of its advantages of high memory density (e.g., the memory unit occupies a small area), fast operating speed, low power consumption, and low costs. According to the principle of operating the RRAM, when a high voltage is applied to a dielectric material, a conductive path may be formed within the dielectric material, such that the dielectric material is changed from the high-resistance state to the low-resistance state; after that, the dielectric material may return to the high-resistance state if the "reset" step is performed. In this way, the dielectric material may provide two distinct states respectively corresponding "0" and "1", such that it may serve as a memory unit for storing digital information.

In various RRAMs, the hafnium oxide-based resistive random access memory draws great attention because of excellent durability and fast switching speed. However, the currently used titanium/hafnium oxide (Ti/HfO$_2$) type resistive random access memory is often difficult to stay in the low-resistance state at a high temperature, which may degrade the so-called "high-temperature data retention". Accordingly, it is necessary to conduct relevant researches for further improvement.

SUMMARY OF THE INVENTION

Technical Problems to be Solved

The invention provides a resistive random access memory and a method of fabricating the same, which may resolve the high-temperature data retention fail (HTDR-fail) problem of the resistive random access memory at a high temperature.

Technical Solutions

The invention provides a resistive random access memory which includes a first electrode layer, a second electrode layer, and a stacked structure disposed between the first electrode layer and the second electrode layer. The stacked structure includes a conductive layer made of HfO$_x$ and a resistance variable layer made of HfO$_y$, wherein x<y, and the diffusion rate of oxygen ions in the conductive layer is lower than the diffusion rate of the oxygen ions in metal, such as Ti or Hf.

The invention provides a method of fabricating a resistive random memory, and the method includes forming a first electrode layer on a substrate; forming a stacked structure on the first electrode layer; and forming a second electrode layer on the stacked structure. The stacked structure includes a conductive layer made of HfO$_x$ and a resistance variable layer made of HfO$_y$, wherein x<y, and the diffusion rate of oxygen ions in the conductive layer is lower than the diffusion rate of the oxygen ions in metal.

In an embodiment of the invention, 0.05<x<0.5, and 1<y<3.

In an embodiment of the invention, x is approximately equal to 0.25, and y is approximately equal to 2.

In an embodiment of the invention, the conductive layer comprises polycrystalline materials having a monoclinic structure and a hexagonal closed packed (HCP) structure, and the resistance variable layer comprises a monoclinic structure and an amorphous structure.

In an embodiment of the invention, the monoclinic structure accounts for 50% to 80% of the volume of the conductive layer.

In an embodiment of the present invention, the resistivity of the conductive layer is 200 μΩcm to 100000 μΩcm.

In an embodiment of the invention, the thickness of the conductive layer is 5 nm to 50 nm.

In an embodiment of the invention, the thickness of the resistance variable layer is 2 nm to 10 nm.

In an embodiment of the invention, materials of the first electrode layer and the second electrode layer are respectively selected from the group consisting of TiN, TaN, Pt, Ir, and graphite.

Beneficial Effects

Based on the above, an embodiment of the invention provides a resistive random access memory and a method of fabricating the same, and a conductive layer which may temporary store oxygen ions is formed between the resistance variable layer and the electrode layer to prevent the oxygen ions from diffusing back to the resistance variable layer at a high temperature environment, so as to resolve the HTDR-fail problem of the resistive random access memory at a high temperature.

In order to make the aforementioned and other features and advantages of the invention more comprehensible, several embodiments accompanied with figures are described in detail below.

DESCRIPTION OF THE EMBODIMENTS

With reference to the accompanying drawings hereinafter, exemplary embodiments of the invention are provided below; however, the invention may be embodied in different forms and should not be limited to the embodiments set forth herein.

Figure 1:
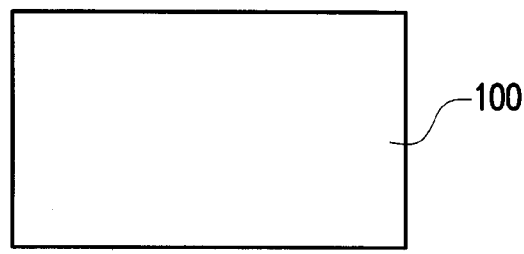
FIG. 1 to FIG. 4 are cross-sectional flow charts illustrating a process of fabricating a resistive random access memory according to a first embodiment of the invention.

As shown in FIG. 1, a substrate 100 is provided. The material of the substrate 100 is not particularly limited and is usually a semiconductor substrate, such as a silicon substrate, etc. Other devices including semiconductor devices (e.g., diodes or transistors) and conductive plugs may already be formed in the substrate 100, which is however not shown in FIG. 1. The aforementioned diodes, transistors, or other device may be used as switching devices of the resistive random access memory.

Figure 2:
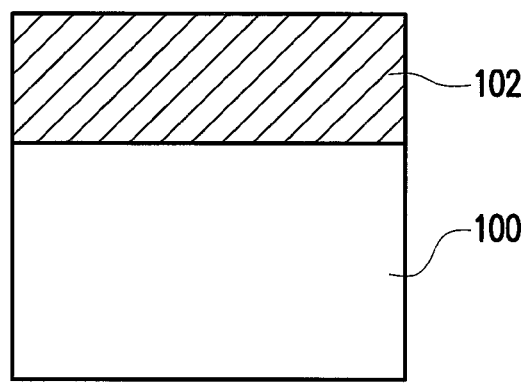

As shown in FIG. 2, a first electrode layer 102 is formed on the substrate 100. The material of the first electrode layer 102 is not particularly limited, and any conventional conductive material is applicable, for example, titanium nitride (TiN), tantalum nitride (TaN), titanium aluminum nitride (TiAlN), titanium tungsten (TiW) alloy, tungsten (W), ruthenium (Ru), platinum (Pt), iridium (Ir), graphite, mixtures of the aforesaid materials, or a stacked layer containing said materials; preferably, the material of the first electrode layer 102 is TiN, TaN, Pt, Ir, graphite, or a combination thereof. The method of forming the first electrode layer 102 is not particularly limited and often includes a physical vapour deposition process, such as a direct-current sputtering process, a radio frequency magnetron sputtering process, and so on. The thickness of the first electrode layer 102 is not particularly limited and is usually between 5 nm and 500 nm.

Figure 3:
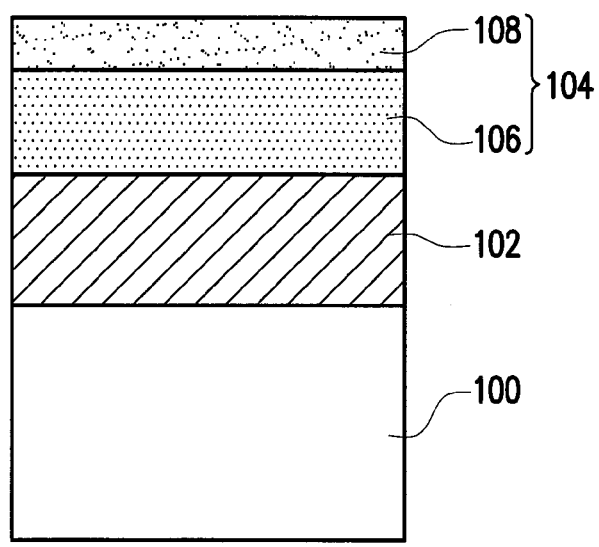

As shown in FIG. 3, a stacked structure is formed on the first electrode layer 102. In the present embodiment, the stacked structure 104 includes a bilayer structure composed of a conductive layer 106 and a resistance variable layer 108.

In the present embodiment, the compositions of the conductive layer 106 and the resistance variable layer 108 are both the hafnium (Hf) oxides. However, the oxygen mole fractions of the conductive layer 106 and the resistance variable layer 108 are different, such that the conductive layer 106 and the resistance variable layer 108 have two different properties. Specifically, each of the conductive layer 106 and the resistance variable layer 108 is substantially conductive (e.g., the resistivity is between 200 µΩcm to 100000 µΩcm) and is electrically insulated before any voltage is applied. Substantially, the composition of the conductive layer 106 is $HfO_x$, and the composition of the resistance variable layer 108 is $HfO_y$, wherein x<y. In other words, comparing to the resistance variable layer 108, the conductive layer 106 is made of an O-deficient material. The value of x is preferably between 0.05 and 0.5, and the value of y is preferably between 1 and 3. Since the binary system of hafnium and oxygen has two stable phases (i.e., $HfO_{0.25}$ and $HfO_2$) at the temperature equal to or less than 2000K. Therefore, when the values of x and y fall within the above range, the internal structures of the materials of the conductive layer 106 and the resistance variable layer 108 may stay stable throughout the entire memory fabricating process, thus enhancing the process yield. Preferably, x is approximately equal to 0.25, and y is approximately equal to 2. It must be mentioned that "about" or "approximately" used herein to modify certain value indicates that an error range of ±10%, should be allowed.

The conducting layer 106 may be formed through performing any conventional film process, such as reactive sputtering and any other physical vapour deposition process, and the thickness of the conductive layer 106 is between 5 nm and 50 nm, for instance. The resistance variable layer 108 may also be formed through performing the physical vapour deposition process; alternatively, considering that the thickness of the resistance variable layer 108 is generally limited within a small range (e.g., 2 nm to 10 nm), the resistance variable layer 108 is preferably formed through performing an atomic layer deposition process. After the conducting layer 106 and the resistance variable layer 108 are formed by conducting the above-mentioned method, the conductive layer 106 may be made of polycrystalline materials having a monoclinic structure and a hexagonal closed packed structure, and the monoclinic structure accounts for 50% to 80% of the volume of the conductive layer. The resistance variable layer 108 includes a monoclinic structure and an amorphous structure.

The mechanism of switching the states of the conducting layer 106 and the resistance variable layer 108 between the high-resistance state and the low-resistance state will be described in the second embodiment with reference to FIG. 5. Besides, it is should be mentioned that, the embodiment shown in FIG. 3 discloses that the conductive layer 106 is formed, and then the resistance variable layer 108 is formed; however, the order of forming these two film layers is not limited herein. In another embodiment, the resistance variable layer is formed on the first electrode layer 102, and then the conductive layer is formed on the resistance variable layer.

Figure 4:
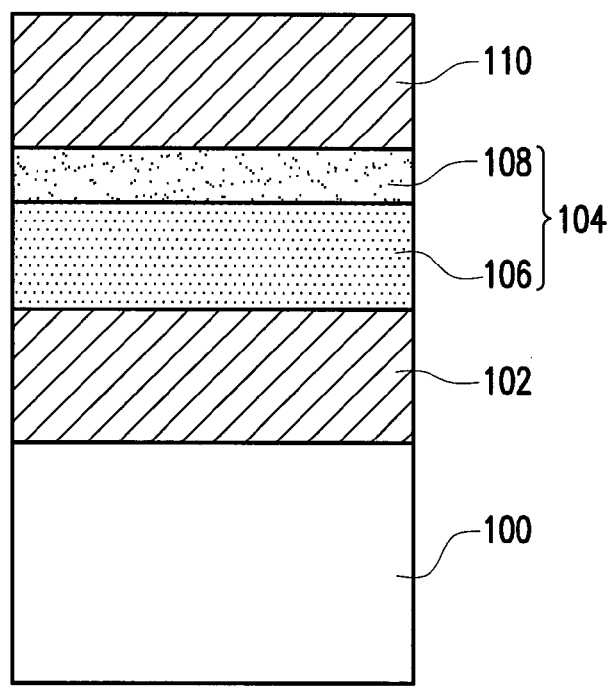

As shown in FIG. 4, a second electrode layer 110 is formed on the stacked structure 104, and the fabrication of the resistive random access memory is completed. The material, the thickness, and the fabricating method of the second electrode layer 110 are the same as those of the first electrode layer 102 and thus will not be further described hereinafter.

Figure 5:
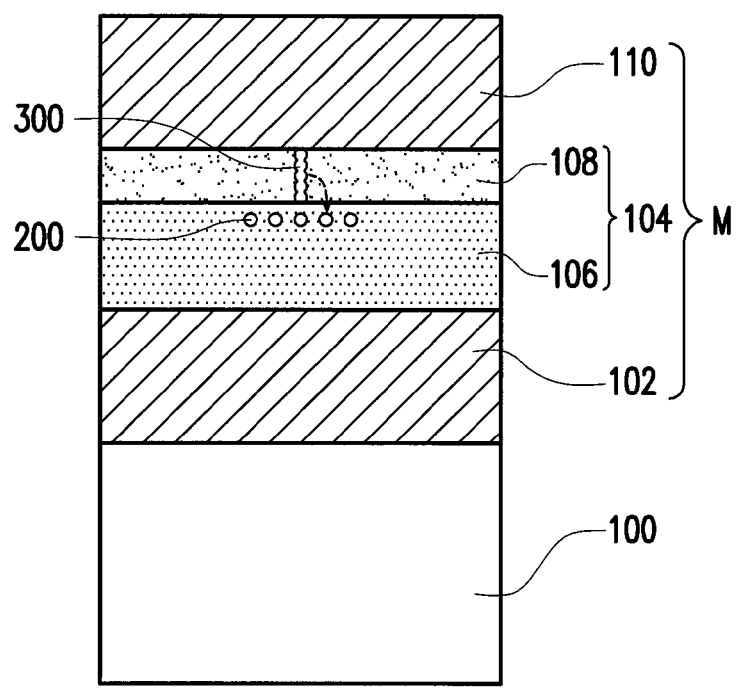
FIG. 5 is a cross-sectional diagram illustrating a resistive random access memory according to a second embodiment of the invention.

FIG. 5 illustrates a resistive random access memory according to the second embodiment of the invention.

As shown in FIG. 5, in the present embodiment, the resistive random access memory includes a first electrode layer 102, a second electrode layer 110, and a stacked structure 104 which are disposed on the substrate 100, and the stacked structure 104 is disposed between the first electrode layer 102 and the second electrode layer 110. The stacked structure 104 includes a conductive layer made of $HfO_x$, and a resistance variable layer made of $HfO_y$, wherein x<y. The materials, the thicknesses, and the fabricating methods of the first electrode layer 102, the second electrode layer 110, and the stacked structure 104 may be same as those described in the first embodiment and thus will not be further described. The following description with reference to FIG. 5 will be mainly directed to a possible operating mechanism of the resistive random access memory.

In FIG. 5, the structure made of the first electrode layer 102, the second electrode layer 110, and stacked structure 104 will be described as a memory unit M hereinafter. Since the resistance variable layer 108 is substantially electrically insulated at first, there is originally an open circuit between the first electrode layer 102 and the second electrode layer 110. At this time, if there is a high voltage difference between the first electrode layer 102 and the second electrode layer 110, the oxygen ions ($O^{2-}$) 200 of the resistance variable layer 108 are attracted by a positive potential and then leave the resistance variable layer 108. In FIG. 5, the oxygen ions enter the conductive layer 106, and the movement path is shown by a dotted arrow. Thereby, conductive filaments 300 composed of Oxygen vacancy are formed inside the resistance variable layer 108, and thus the memory unit M is changed from the high-resistance state to the low-resistance state.

There is no conductive layer 106 in the conventional resistive random access memory; therefore, after the oxygen ions leave the resistance variable layer, the oxygen ions enter a metal layer acting as the electrode, and the material of the metal layer is hafnium (Hf) or titanium (Ti). However, the diffusion rate of the oxygen ions is rather high in such metal layer, and the oxygen ions may have a chance to return back to the resistance variable layer through diffusion even at a room temperature. If the subsequent processes of the resistive random access memory include a high-temperature processing step (e.g., the package process may be performed at a temperature up to about 200° C.), the issue that the oxygen ions diffusing back to the resistance variable layer becomes worse. If an excessive number of oxygen ions return to the resistance variable layer, and these oxygen ions are recombined with the oxygen vacancy, the conductive filaments may accordingly be broken and the memory unit M may not stay in the low-resistance state. This is the so-called "high-temperature data retention fail (HTDR-fail)" problem.

In order to resolve this conventional problem, researchers have proposed some other methods, such as arranging a material layer between the electrode and the resistance variable layer. However, the material layer is a dielectric layer, and therefore the methods of arranging the dielectric layer between the electrode and the resistance variable layer requires strict control of the thickness of the dielectric layer (e.g., less than 5 nm or even in unit of Å), so as to prevent non-conductivity of the devices. Moreover, the composition of the material layer and the material of the resistance variable layer within the manufacturing temperature range may usually be in different phases, thus resulting in the difficulties in the design of the manufacturing process design and the control of device performance.

By contrast, in the present embodiment, when the material of the resistance variable layer 108 is hafnium oxide, a conductive layer 106 that is composed of the same atoms (i.e., oxygen and hafnium) but has the different relative proportions (e.g., a relatively small oxygen ratio) may be disposed between the electrode layer and the resistance variable layer 108, so as to resolve the HTDR-fail problem. Since the diffusion rate of the oxygen ions 200 in the conductive layer 106 is much lower than the diffusion rate of the oxygen ions 200 in the metal material, once the oxygen ions 200 are driven by an electric field and thus enter into the conductive layer 106, and if there is no opposite electric field, in the high-temperature state, the oxygen ions 200 may tend to stay in the conductive layer 106 without returning back to the resistance variable layer 108. Besides, due to the "conductive" characteristics of the conductive layer 106, the thickness of the conductive layer 106 need not be controlled to be at the nanometer-level and may be up to about 50 nm. Furthermore, as previously mentioned, due to the presence of two stable phases in the binary system of oxygen and hafnium, the materials of the conductive layer 108 and the resistance variable layer 106 are limited to the those described in the embodiments above, so as to improve the product yield.

To sum up, an embodiment of the invention provides a resistive random access memory and a method of fabricating the same, and a conductive layer which may temporary store oxygen ions is formed between the resistance variable layer and the electrode layer to prevent the oxygen ions from diffusing back to the resistance variable layer at a high temperature environment, so as to resolve the problem that the resistive random access memory at a high temperature cannot maintain high-temperature data retention.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A resistive random access memory, comprising:
   a first electrode layer;
   a second electrode layer; and
   a stacked structure located between the first electrode layer and the second electrode layer, the stacked structure comprising a conductive layer made of $HfO_x$ and a resistance variable layer made of $HfO_y$, wherein $0.05<x<0.5$, and $1<y<3$.

2. The resistive random access memory according to claim 1, wherein x is equal to 0.25, and y is equal to 2.

3. The resistive random access memory according to claim 1, wherein the conductive layer comprises polycrystalline materials having a monoclinic structure and a hexagonal closed packed structure, and the resistance variable layer comprises a monoclinic structure and an amorphous structure.

4. The resistive random access memory according to claim 1, wherein a monoclinic structure accounts for 50% to 80% of a volume of the conductive layer.

5. The resistive random access memory according to claim 1, wherein resistivity of the conductive layer is 200 $\mu\Omega$cm to 100000 $\mu\Omega$cm.

6. The resistive random access memory according to claim 1, wherein a thickness of the conductive layer is 5 nm to 50 nm.

7. The resistive random access memory according to claim 1, wherein a thickness of the resistance variable layer is 2 nm to 10 nm.

8. The resistive random access memory according to claim 1, wherein materials of the first electrode layer and the second electrode layer are respectively selected from the group consisting of TiN, TaN, Pt, Ir, and graphite.

9. A method of fabricating a resistive random memory, the method comprising:
   forming a first electrode layer on a substrate;
   forming a stacked structure on the first electrode layer; and
   forming a second electrode layer on the stacked structure,
   wherein the stacked structure comprises a conductive layer made of $HfO_x$ and a resistance variable layer made of $HfO_y$, wherein $0.05<x<0.5$, and $1<y<3$.

* * * * *